United States Patent [19]

Yoon et al.

[11] Patent Number: 5,677,877
[45] Date of Patent: Oct. 14, 1997

[54] INTEGRATED CIRCUIT CHIPS WITH MULTIPLEXED INPUT/OUTPUT PADS AND METHODS OF OPERATING SAME

[75] Inventors: Sei-Seung Yoon, Seoul; Tae-Seong Jang, Kyungki-do, both of Rep. of Korea

[73] Assignee: Samsung Electronics Co., Ltd., Suwon, Rep. of Korea

[21] Appl. No.: 651,375

[22] Filed: May 22, 1996

[30] Foreign Application Priority Data

May 25, 1995 [KR] Rep. of Korea .................. 95-13273

[51] Int. Cl.$^6$ ............................... G11C 7/00; G11C 8/00
[52] U.S. Cl. ........................ 365/189.02; 365/189.05; 365/189.08; 365/230.02; 365/230.08
[58] Field of Search ...................... 365/189.02, 189.05, 365/189.08, 230.02, 230.08

[56] References Cited

U.S. PATENT DOCUMENTS

| | | | |
|---|---|---|---|
| 4,899,313 | 2/1990 | Kumanoya et al. | 365/189.08 |
| 5,179,573 | 1/1993 | Yamada | 365/189.08 |
| 5,227,997 | 7/1993 | Kikuda et al. | 365/189.08 |
| 5,307,321 | 4/1994 | Sasai et al. | 365/189.02 |
| 5,357,477 | 10/1994 | Matsumoto et al. | 365/230.02 |
| 5,519,655 | 5/1996 | Greenberg | 365/189.02 |

*Primary Examiner*—David C. Nelms
*Assistant Examiner*—Trong Quang Phan
*Attorney, Agent, or Firm*—Bell, Seltzer, Park & Gibson

[57] ABSTRACT

Integrated circuit chips with multiplexed input/output pads include means for expanding the functional and diagnostic capability of the circuit by increasing the effective number of input/output pads connected thereto so that more information can be provided to and from the chip. In particular, multiplexing means preferably provides the capability of accessing any one of a plurality of signal lines in the circuit from each input/output pad. This expanded capability is preferably achieved using one or more selection control signals which can be generated internally or externally to a chip containing the integrated circuit. An integrated circuit memory device, for example, preferably comprises a semiconductor substrate, a memory circuit in the substrate, a plurality of input/output pads and means, coupled to signal lines in the memory circuit, for multiplexing the plurality of input/output pads to the signal lines by electrically connecting respective ones of the signal lines to the input/output pads in response to a first select signal and electrically connecting respective others of the signal lines to the input/output pads in response to a second select signal. Because each pad on a chip can be connected to one or more signal lines, the memory circuit has a greater number of effective pads which means that a fewer number of pads on a small memory circuit chip can provide essentially the same input/output capability as a greater number of pads on a larger chip.

29 Claims, 4 Drawing Sheets

INTEGRATED CIRCUIT CHIPS WITH MULTIPLEXED INPUT/OUTPUT PADS AND METHODS OF OPERATING SAME

FIELD OF THE INVENTION

The present invention relates to semiconductor devices, and more particularly to integrated circuit semiconductor devices.

Background of the Invention

Input/output pads are provided on integrated circuit chips as a means for communicating information to and from circuits on the chips and once the chips have been packaged typically provide the only means of communicating with the integrated circuits therein. Accordingly, the number of input/output pads typically dictates the number of signal lines within the integrated circuit that can be accessed to transmit input information or receive output information during functional operation of the chip. For example, FIG. 1 illustrates an integrated circuit having three input/output pads (10, 20 and 30) for communicating with three respective signal lines (A0, B0 and C0). However, as integrated circuits become more highly integrated for a given chip size, there is a greater need to use the input/output pads sparingly. This is especially true as the sizes of the chips are reduced in dimensions and the number of pads are reduced to accommodate the smaller chip area. The ability to diagnostically test packaged chips, which also requires access via the input/output pads, is also limited as the relative number of pads is reduced as integration densities are increased.

SUMMARY OF THE INVENTION

It is therefore an object of the present invention to provide improved integrated circuits and methods of operating same.

It is another object of the present invention to provide integrated circuits having expanded functional and diagnostic capability and methods of operating same.

It is still a further object of the present invention to provide integrated circuit chips having an effectively greater number of input/output pads for a given chip size and methods of operating same.

These and other objects, features and advantages of the present invention are provided by an integrated circuit containing a plurality of input/output pads for accessing the circuit and multiplexing means for expanding the functional and diagnostic capability of the circuit by increasing the effective number of input/output pads connected thereto. In particular, multiplexing means provides the capability of accessing any one of a plurality of signal lines in the circuit at a time, from an input/output pad. This expanded capability is preferably achieved using one or more selection control signals which can be generated internally or externally to a chip containing the integrated circuit. According to a preferred embodiment, an integrated circuit memory device comprises a semiconductor substrate, a memory circuit in the substrate, a plurality of input/output pads on the substrate and means, coupled to signal lines in the memory circuit, for multiplexing the plurality of input/output pads to the signal lines by electrically connecting respective ones of the signal lines to the input/output pads in response to a first select signal and electrically connecting respective others of the signal lines to the input/output pads in response to a second select signal.

To provide the multiplexing capability efficiently, multiplexing means includes means for generating the first and second select signals (or more), means for disposing the first select signal in an enabling state (e.g., Logic 1) to electrically connect the respective ones of the signal lines to the input/output pads and means for disposing the second select signal in an enabling state to electrically connect respective others of the signal lines to the input/output pads. To prevent electrical connection of an input/output pad to more than one signal line at a time, these first and second signals are preferably disposed in their respective enabling states during nonoverlapping time intervals. Multiplexing means also comprises pass transistors connected in series between the signal lines and the input/output pads so that when enabled the pass transistors will provide an electrical "short" between a signal line and a respective pad and when disabled the pass transistors will provide and electrical "open", thereby disconnecting a signal line from a respective pad.

Thus, an integrated circuit according to the present invention has expanded functional and diagnostic capability because each input/output pad for accessing internal signal lines (as outputs or inputs) can be connected to a plurality of different signal lines. Because each pad on a chip can be connected to one or more signal lines, the integrated circuit has a greater number of effective pads. Accordingly, in the event the size of the chip is reduced, a fewer number of pads can provide essentially the same input/output capability as a greater number of pads on a larger chip.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
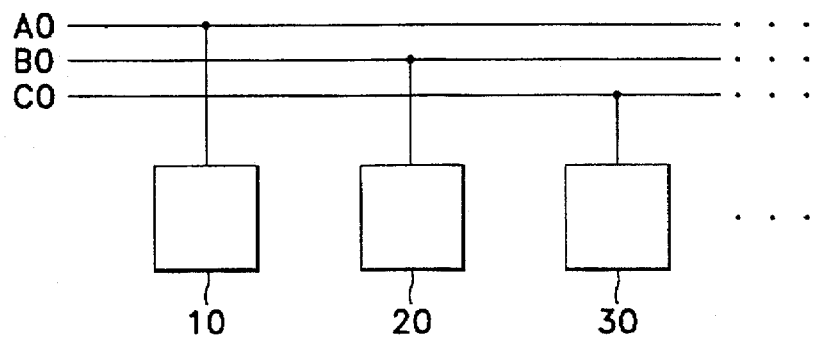
FIG. 1 illustrates an electrical schematic of interconnected input/output pads and signal lines on an integrated circuit chip, according to the prior art.
Figure 2:
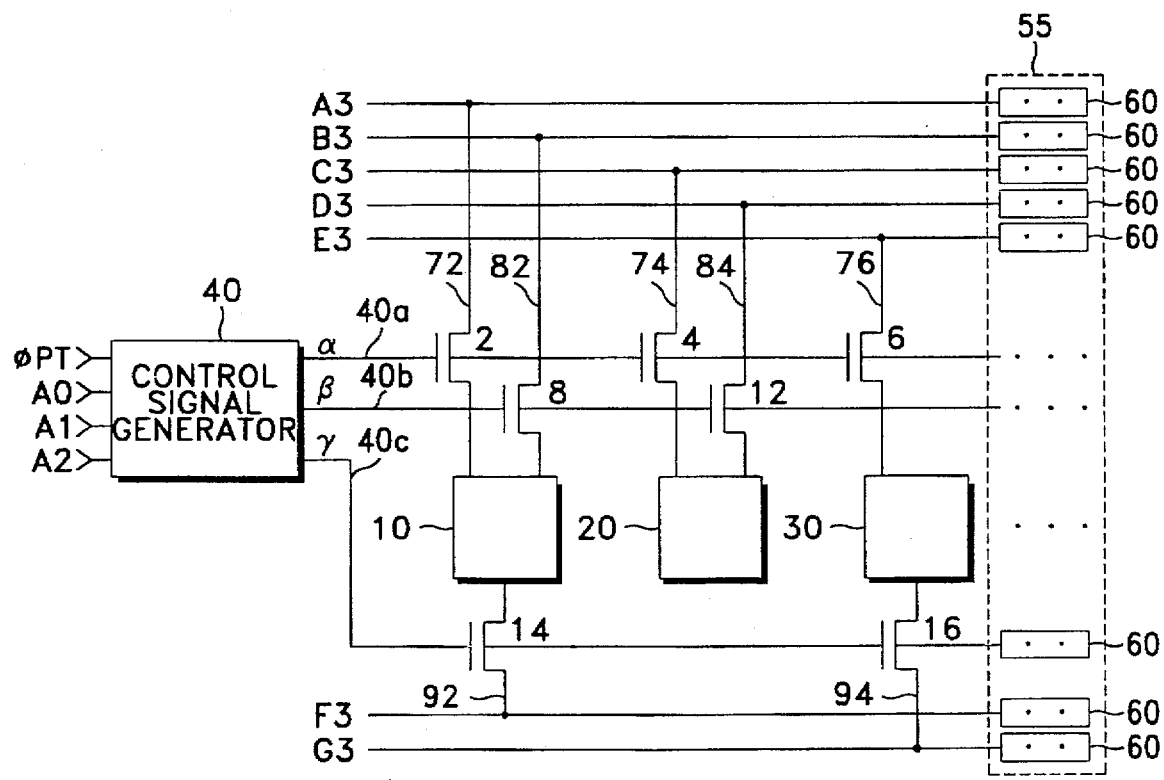
FIG. 2 illustrates an electrical schematic of an integrated circuit chip according to a first embodiment of the present invention.

Referring now to FIG. 2, an integrated circuit chip according to a first embodiment of the present invention will be described. In particular, FIG. 2 illustrates the interconnection between a plurality of input/output pads 10, 20 and 30, a memory circuit 55 (e.g., RAM, ROM), containing a plurality of signal lines (e.g., A3, B3, C3, D3, E3, F3 and G3) which are electrically connected to devices 60 in the memory circuit 55, and means for multiplexing the input/output pads to the signal lines. In the illustrated first embodiment, multiplexing means preferably comprises means 40 for generating select signals ($\alpha$, $\beta$, $\gamma$) and pass transistors (2,4,6,8,12,14,16), illustrated as N-channel MOSFETs having respective control gates (e.g., gate electrodes). The pass transistors are electrically connected in series between respective signal lines and input/output pads.

Preferred operation of the first embodiment is achieved by generating a first select signal (α) on a first select signal line 40a and disposing it in an enabling state (e.g., logic 1) to thereby turn-on a plurality of first pass transistors (2,4,6). As will be understood by those skilled in the art, turn-on of the first pass transistors results in an electrical connection or "short" between the first signal lines (A3,C3,E3) and the input/output pads 10, 20 and 30, via first interconnect lines (72, 74 and 76). Thus, upon generation of the first select signal (α), the input/output pads can be accessed in order to transmit input data to the first signal lines and/or receive output data from the first signal lines during diagnostic testing or functional operation of the memory circuit. Similarly, generation of the second select signal (β) (on a second select signal line 40b) and third select signal (γ) (on a third select signal line 40c) to turn-on a plurality of second pass transistors (8,12) and third pass transistors (14,16), respectively, also results in an electrical connection or "short" between the second signal lines (B3,D3) and third signal lines (F3,G3), respectively, and the input/output pads 10, 20 and 30, via second and third interconnect lines (82,84) and (92,94). Thus, because each of the input/output pads on the integrated circuit chip can be connected one-at-a-time to a plurality of signal lines, the integrated circuit chip illustrated in FIG. 2 effectively has seven (7) input/output pads even though there are only three physical pads 10, 20 and 30 on the substrate.

Figure 3:
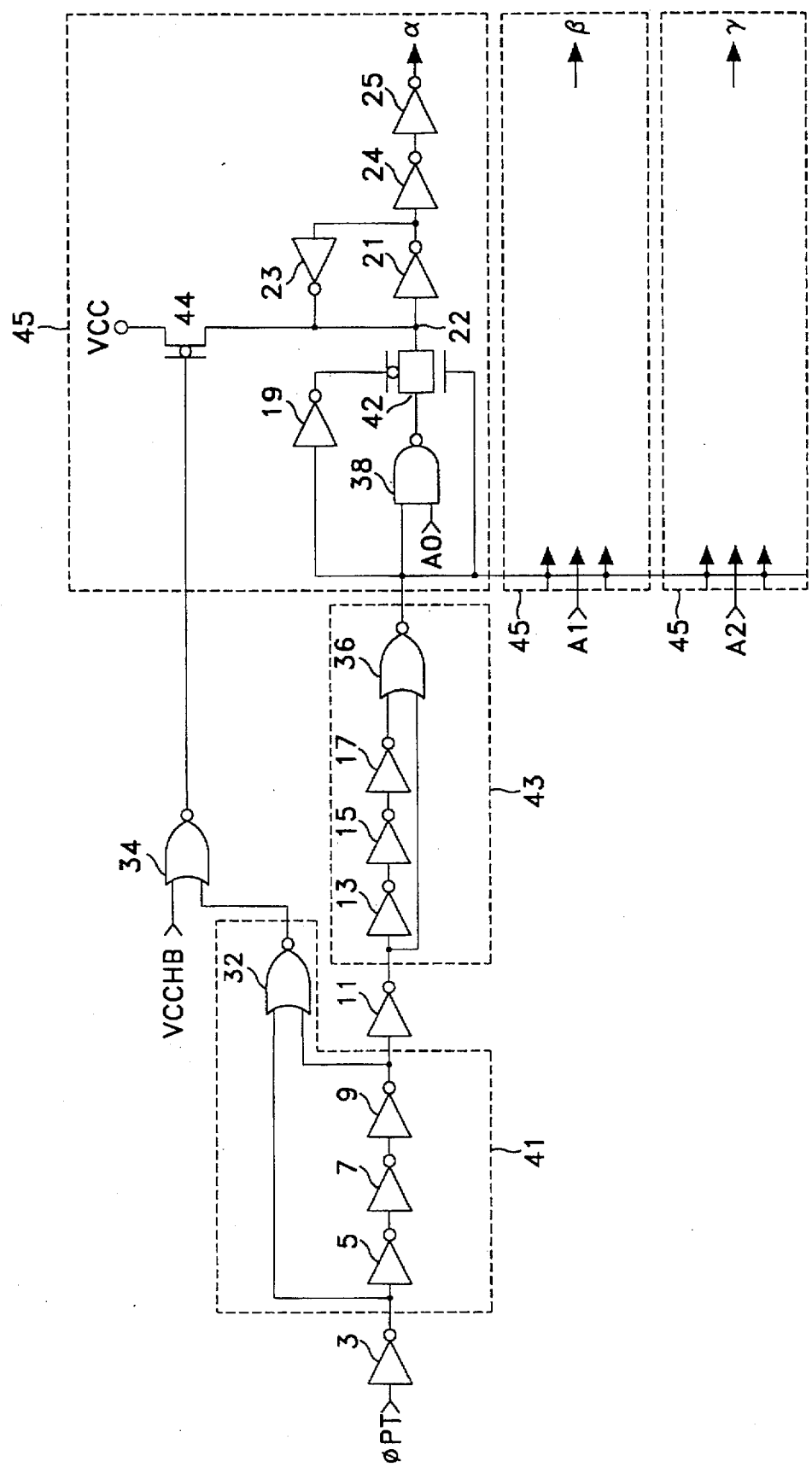
FIG. 3 illustrates an electrical schematic of a control signal generator of FIG. 2.
Figure 4:
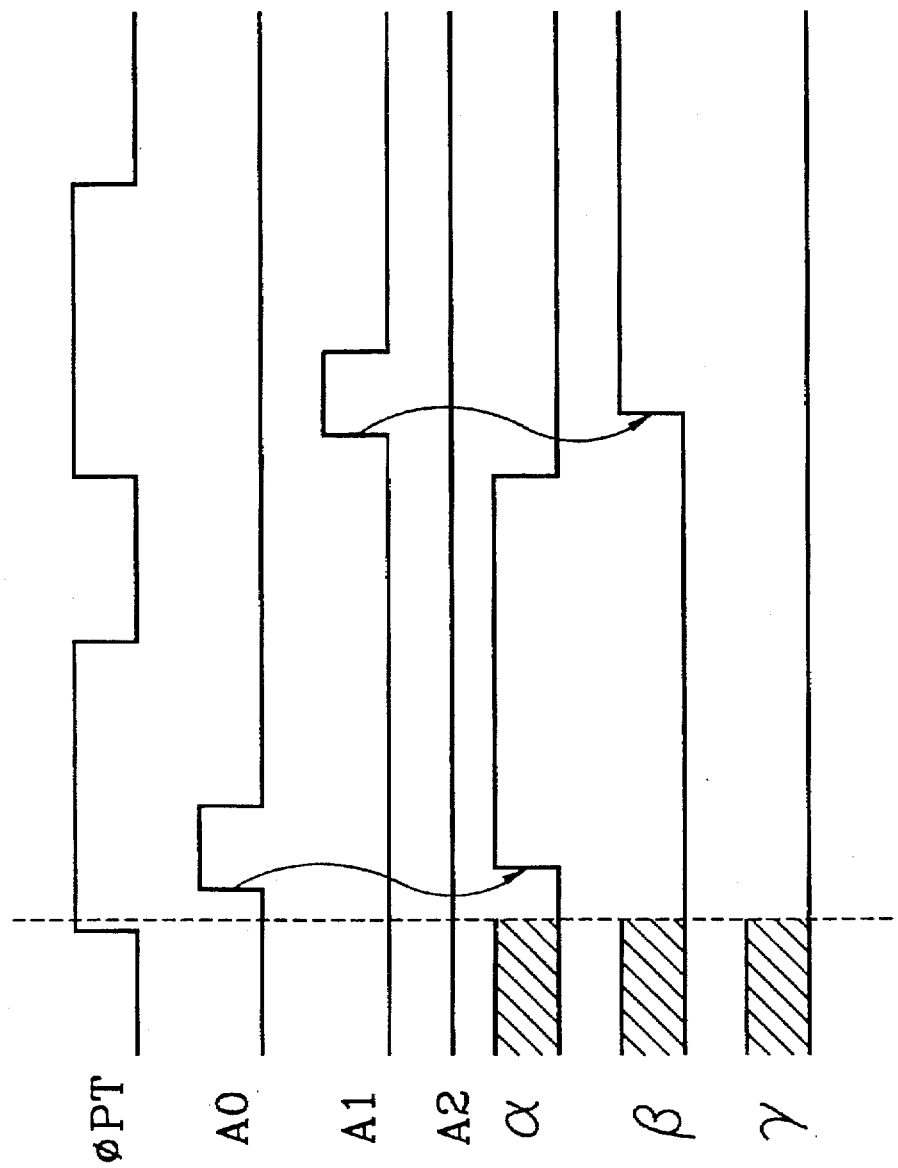
FIG. 4 illustrates a timing diagram showing the operation of the control signal generator of FIG. 3.

Referring now to FIGS. 3 and 4, the construction and operation of the select signal generating means 40 of FIG. 2 will be described. In particular, FIG. 3 illustrates first and second pulse generators 41 and 43, respectively, and a first select signal generating unit 45. The first select signal generating unit 45 is responsive to outputs from the first and second pulse generators and generates the first select signal (α) in response to those outputs and an externally generated first control signal (A0) which is illustrated in FIG. 4 as a logic 1 pulse. FIG. 3 also illustrates second and third select signal generating units 45 for generating the second and third select signals (β, γ) in response to second and third control signals (A1) and (A2), respectively, which are also illustrated in FIG. 4 as logic 1 pulses. The second and third select signal generating units 45 for generating the second and third select signals are also responsive to respective pairs of pulse generators (not shown) having the same construction as the first and second pulse generators 41 and 43.

As illustrated best by FIG. 3, the first pulse generator 41 includes three serially connected inverters (5, 7 and 9) and a NOR gate 32 which receives as inputs the input to the first inverter 5 and the output of the third inverter 9. Accordingly, when a normally low (e.g., logic 0) pad transfer signal (φPT) changes from a low to a high state (i.e., 0→1), as shown at time t=0 corresponding to the dotted line in FIG. 4, the output of an input inverter 3 changes states from 1→0. This change of state causes the NOR gate 32 of the first pulse generator 41 to output a first logic 1 pulse to a reset NOR gate 34. As will be understood by those skilled in the art, the duration of this logic 1 pulse is determined by the amount of time it takes the output of the third inverter 9 to change state in response to the change in state of the output of the input inverter 3. This duration equals the sum of the delays of the three inverters (5, 7 and 9). Similarly, the change in state of the output of the input inverter 3 is transmitted from the first pulse generator 41 to the input of the second pulse generator 43 via an intermediate inverter 11. The second pulse generator 43 also preferably comprises three serially connected inverters (13, 15 and 17). Accordingly, when the output of the intermediate inverter 11 changes state from 1→0 in response to the 0→1 change in state of the pad transfer signal (φPT), the NOR gate 36 of the second pulse generator 43 outputs a second logic 1 pulse to the first select signal generating unit 45. The duration of the second logic 1 pulse from the second pulse generator 43 is determined by the amount of time it takes the output of the third inverter 17 to change state in response to the change in state of the output of the intermediate invertor 11.

The second logic 1 pulse from the second pulse generator 43 temporarily renders a two-input pass transistor 42 in a "pass" state in part because the pass-through inverter 19 supplies a logic 0 pulse to the complementary input of the pass transistor 42 in response to the second logic 1 pulse. Accordingly, if the first control signal (A0) is disposed in a logic 1 state at the time the second logic 1 pulse is generated, the NAND gate 38 will transmit a logic 0 pulse to the input (node 22) of a latch comprising antiparallel connected inverters (21, 23). Upon the transmission of the logic 0 pulse from the NAND gate 38, the output of a latch inverter 21 will latch into a logic 1 state. This logic 1 state is then transmitted through two buffer inverters 24 and 25 as the first select signal (α) which is illustrated by FIG. 4.

As further illustrated by FIG. 4, the duration of the logic 1 state associated with the first select signal (α) is greater than the duration of the logic 1, state associated with the externally generated first control signal A0. Thus, the first select signal (α) is generated as a logic 1 pulse of first duration in response to the first control signal A0. Here, as illustrated and described above, the first control signal A0 is provided as a logic 1 pulse of second duration which is less than the first duration.

The above described operations for generating the first select signal are also applicable to the second and third select signals (β, γ), upon the next occurrence of a 0→1 change in state of the pad transfer signal (φPT) in combination with the second and third control signals (A1) and (A2) being disposed in a logic 1 state, respectively. However, to prevent the occurrence of overlapping select signals, the first logic 1 pulse causes a logic 0 reset pulse to be generated by the reset NOR gate 34 if the VCCHB signal is a logic 0. The VCCHB signal may be internally generated. As illustrated by FIG. 3, this logic 0 reset pulse is provided to the gate electrode of a P-channel MOSFET 44 which is connected in series between the input of the latch (node 22) and a logic 1 power supply signal (VCC). As will be understood by those skilled in the art, the occurrence of a logic 0 reset pulse causes the P-channel MOSFET 44 to become conductive and "pull-up" the latch input (node 22) to a logic 1 value. This results in a reset of the output of the latch to a logic 0 state which is passed through the buffer inverters as the first select signal (α). Thus, so long as two or more of the externally generated control signals (A0, A1 and A2) do not simultaneously have a logic 1 state at the time of the second logic 1 pulse is generated by the second pulse generator 43, the input/output pads 10, 20 and 30 will not become connected to more than one signal line at a time.

Figure 5:
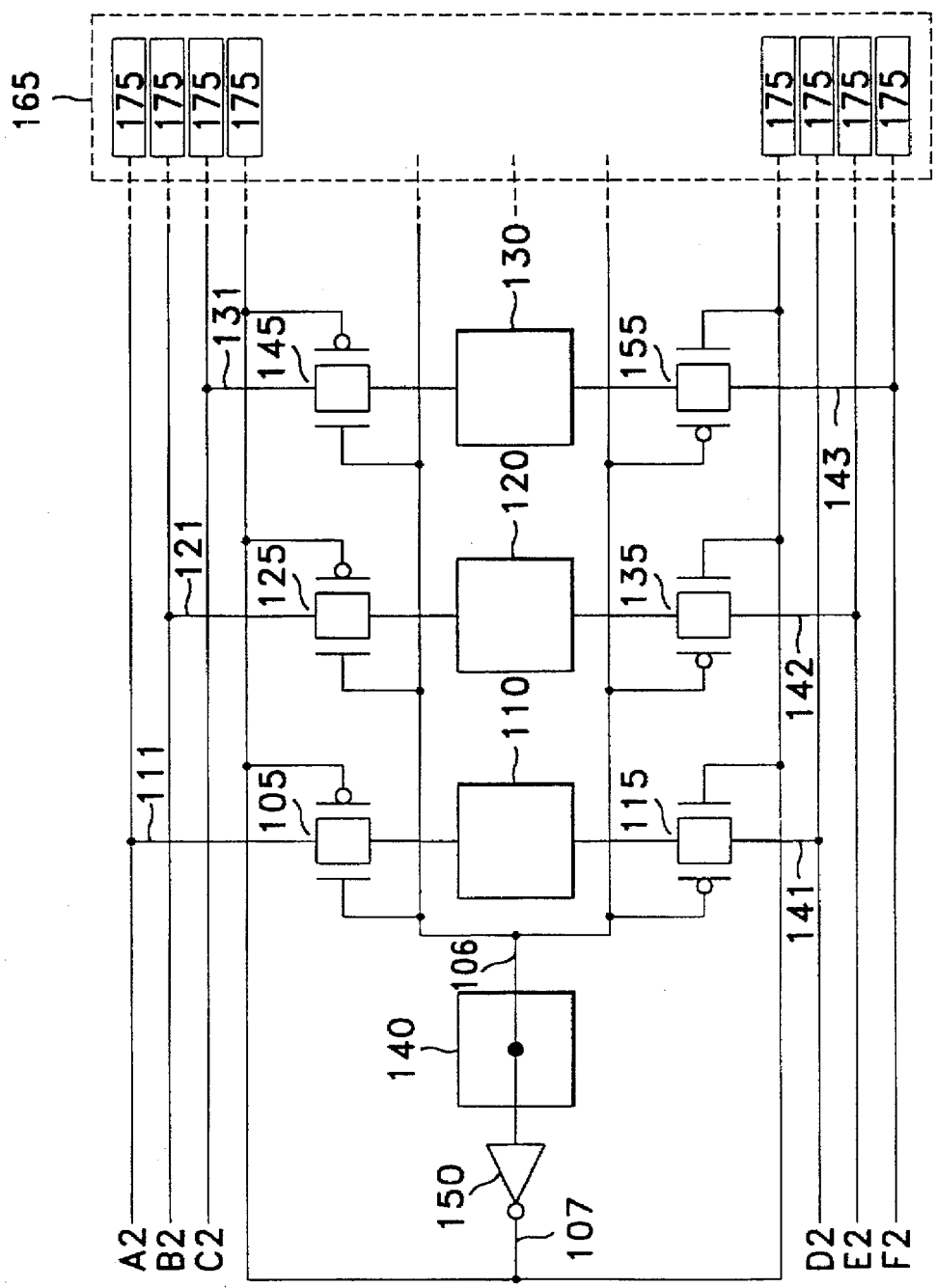
FIG. 5 illustrates an electrical schematic of an integrated circuit chip according to a second embodiment of the present invention.

Referring now to FIG. 5, the construction and operation of a second embodiment of the present invention will be described. In particular, FIG. 5 illustrates the interconnection between a plurality of input pads (110, 120 and 130), a memory circuit 165 (e.g., RAM, ROM) containing a plurality of signal lines (e.g., A2, B2, C2, D2, E2 and F2) which are electrically connected to devices 175 in the memory circuit 165, and means for multiplexing the input/output pads one-at-a-time to two different signal lines, depending on whether an input pad 140 is maintained at a logic 0 state or a logic 1 state. In particular, if the input pad 140 is biased to a logic 0 state, an input inverter 150 will maintain a first pass line 107 at a logic 1 state which will cause a first set of pass transistors (115, 135 and 155) to enter a pass state. When this occurs, the input/output pads will become electrically connected to signal lines D2, E2 and F2 via a first set of interconnect lines (141–143). Alternatively, if the input pad 140 is biased to a logic 1 state, the input inverter 150 will maintain the first pass line 107 at a logic 0 state which will cause a second set of pass transistors (105, 125 and 145) to enter a pass state because a second pass line 106 will be at a logic 1 state. When this occurs, the input/output pads will become electrically connected to signal lines A2, B2 and C2 via a second set of interconnect lines (111, 121 and 131). Thus, according to this second embodiment, each input/output pad can be selected to communicate one-at-a-time with two different signal lines.

Accordingly, as described above an integrated circuit such as a memory circuit according to the present invention has expanded functional and diagnostic capability because each input/output pad can be connected with a plurality of different signal lines within the memory circuit. Because each pad on a chip can be connected to one or more signal lines, the memory circuit has a greater number of effective pads which means that a fewer number of pads on a small memory circuit chip can provide essentially the same input/output capability as a greater number of pads on a larger chip.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device having multiplexed input/output pads, comprising:

a memory circuit containing signal lines electrically connected to devices therein;

a plurality of input/output pads; and means, coupled to said signal lines, for multiplexing said plurality of input/output pads to said signal lines by electrically connecting respective ones of said signal lines to said plurality of input/output pads in response to a first select signal and by electrically connecting respective others of said signal lines to said plurality of input/output pads in response to a second select signal, so that said plurality of input/output pads can be electrically connected to more than one of said signal lines;

wherein said multiplexing means is responsive to a plurality of control signals generated external to said integrated circuit memory device;

wherein said multiplexing means comprises means for generating the first and second select signals so that the first select signal is disposed in an enabling state to thereby electrically connect the respective ones of said signal lines to said plurality of input/output pads and the second select signal is disposed in an enabling state to thereby electrically connect the respective others of said signal lines to said plurality of input/output pads;

wherein the first select signal and the second select signal are disposed in their respective enabling states during respective nonoverlapping time intervals; and wherein said means for generating the first select signal comprises first and second pulse generators for generating first and second pulses, respectively, and a first latch, responsive to the first and second pulses and at least one of the plurality of externally generated control signals.

2. The memory device of claim 1, wherein said means for generating the second select signal comprises third and fourth pulse generators for generating third and fourth pulses, respectively, and a second latch, responsive to the third and fourth pulses and at least another of the plurality of externally generated control signals.

3. The memory device of claim 1, wherein said first latch comprises a pair of antiparallel-connected inverters.

4. The memory device of claim 1, wherein said second pulse generator is responsive to an output of said first pulse generator.

5. The memory device of claim 4, wherein said first and second pulse generators each comprise a respective plurality of serially connected inverters.

6. The memory device of claim 1, wherein said first pulse generator comprises a plurality of serially connected inverters.

7. The memory device of claim 6, wherein an input to a first of said plurality of serially connected inverters and an output of a last of said plurality of serially connected inverters are provided as inputs to a NOR gate.

8. The memory device of claim 7, wherein an input to said second pulse generator is responsive to the output of the last of said plurality of serially connected inverters in said first pulse generator.

9. The memory device of claim 3, wherein said first pulse generator comprises a plurality of serially connected inverters.

10. The memory device of claim 9, wherein an input to a first of said plurality of serially connected inverters and an output of a last of said plurality of serially connected inverters are provided as inputs to a NOR gate.

11. The memory device of claim 10, wherein an input to said second pulse generator is responsive to the output of the last of said plurality of serially connected inverters in said first pulse generator.

12. The memory device of claim 1, wherein said multiplexing means comprises first and second pass transistors connected in series between respective first and second signal lines in said memory circuit and one of said plurality of input/output pads; and first and second select lines connected between said generating means and respective first and second control gates of said first and second pass transistors, so that the first pass transistor is disposed in a pass state in response to the first select signal being disposed in its respective enabling state and the second pass transistor is disposed in a pass state in response to the second select signal being disposed in its respective enabling state.

13. An integrated circuit device having multiplexed input/output pads, comprising:

a circuit containing signal lines electrically connected to devices therein;

a plurality of input/output pads; and means, coupled to said signal lines, for multiplexing said plurality of input/output pads to said signal lines by electrically connecting respective ones of said signal lines to said plurality of input/output pads in response to a first select signal and by electrically connecting respective others of said signal lines to said plurality of input/output pads in response to a second select signal, so that said plurality of input/output pads can be electrically connected to more than one of said plurality of signal lines;

wherein said multiplexing means is responsive to a plurality of control signals generated external to said circuit;

wherein said multiplexing means comprises means for generating the first and second select signals so that the first select signal is disposed in an enabling state to thereby electrically connect the respective ones of said signal lines to said plurality of input/output pads and the second select signal is disposed in an enabling state to thereby electrically connect the respective others of said signal lines to said plurality of input/output pads;

wherein the first select signal and the second select signal are disposed in their respective enabling states during respective nonoverlapping time intervals; and wherein said means for generating the first select signal comprises first and second pulse generators for generating first and second pulses, respectively, and a first latch, responsive to the first and second pulses and at least one of the plurality of externally generated control signals.

14. The integrated circuit device of claim 13, wherein said means for generating the second select signal comprises third and fourth pulse generators for generating third and fourth pulses, respectively, and a second latch, responsive to the third and fourth pulses and at least another of the plurality of externally generated control signals.

15. The integrated circuit device of claim 13, wherein said first latch comprises a pair of antiparallel-connected inverters.

16. The integrated circuit device of claim 13, wherein said second pulse generator is responsive to an output of said first pulse generator.

17. The integrated circuit device of claim 16, wherein said first and second pulse generators each comprise a respective plurality of serially connected inverters.

18. The integrated circuit device of claim 13, wherein said first pulse generator comprises a plurality of serially connected inverters.

19. The integrated circuit device of claim 18, wherein an input to a first of said plurality of serially connected inverters and an output of a last of said plurality of serially connected inverters are provided as inputs to a NOR gate.

20. The integrated circuit device of claim 19, wherein an input to said second pulse generator is responsive to the output of the last of said plurality of serially connected inverters in said first pulse generator.

21. The integrated circuit device of claim 18, wherein said first pulse generator comprises a plurality of serially connected inverters.

22. The integrated circuit device of claim 21, wherein an input to a first of said plurality of serially connected inverters and an output of a last of said plurality of serially connected inverters are provided as inputs to a NOR gate.

23. The integrated circuit device of claim 22, wherein an input to said second pulse generator is responsive to the output of the last of said plurality of serially connected inverters in said first pulse generator.

24. The integrated circuit device of claim 12 wherein said multiplexing means comprises first and second pass transistors connected in series between respective first and second signal lines in said circuit and one of said plurality of input/output pads; and first and second select lines connected between said generating means and respective first and second control gates of said first and second pass transistors, so that the first pass transistor is disposed in a pass state in response to the first select signal being disposed in its respective enabling state and the second pass transistor is disposed in a pass state in response to the second select signal being disposed in its respective enabling state.

25. A method of multiplexing input/output pads of an integrated circuit memory device to signal lines contained therein, comprising the steps of:

electrically connecting respective ones of the signal lines in the memory device to the input/output pads in response to a first select signal; and electrically connecting respective others of the signal lines in the memory device to the input/output pads in response to a second select signal, nonoverlapping in time with the first select signal, so that the input/output pads can be electrically connected to more than one of the signal lines; and wherein said step of electrically connecting respective ones of the signal lines is preceded by the step of generating the first select signal as a first pulse of first duration in response to a second pulse of second duration, less than the first duration, generated external to the memory device.

26. An integrated circuit, comprising:

a plurality of input/output pads;

a plurality of devices;

a plurality of signal lines connected to said plurality of devices;

first and second pass transistors electrically connected in series between first and second signal lines and a first input/output pad; and a select signal generator, coupled to control gates of said first and second pass transistors and containing first and second pulse generating means therein for generating first and second select signals, to turn-on the first pass transistor during first time intervals in response to the first select signal and turn-on the second pass transistor during second time intervals, which are nonoverlapping with the first time intervals, in response to the second select signal.

27. The circuit of claim 26, wherein said first pulse generating means comprises first and second pulse generators for generating first and second pulses, respectively, and latching means which is responsive to the first and second pulses and has an output electrically coupled to the control gate of the first pass transistor.

28. An integrated circuit, comprising:

a plurality of input/output pads;

an input pad;

a first plurality of signal lines coupled to said plurality of input/output pads by a first plurality of pass transistors having respective first control gates;

a second plurality of signal lines coupled to said plurality of input/output pads by a second plurality of pass transistors having respective first control gates; and an inverter having an input electrically coupled to said input pad and said first control gates of said first plurality of pass transistors and an output electrically coupled to said first control gates of said second plurality of pass transistors.

29. The integrated circuit of claim 28, wherein said first and second plurality of pass transistors have respective second complementary control gates; wherein said input pad is electrically coupled to said second control gates of said second plurality of pass transistors; and wherein the output of said inverter is electrically coupled to said second control gates of said first plurality of pass transistors.

* * * * *

UNITED STATES PATENT AND TRADEMARK OFFICE
CERTIFICATE OF CORRECTION

PATENT NO.    :    5,677,877
DATED         :    October 14, 1997
INVENTOR(S)   :    Yoon et al.

It is certified that error appears in the above-identified patent and that said Letters Patent is hereby corrected as shown below:

Column 2, line 61, please delete the comma appearing after "ROM)".

Column 4, line 29, "l" should read --1--.

Claim 21, line 1, "18" should read --15--.

Claim 24, line 1, "12" should read --13--.

Signed and Sealed this

Twenty-third Day of June, 1998

BRUCE LEHMAN

Attest:

Attesting Officer

Commissioner of Patents and Trademarks